United States Patent
Tanabe

(10) Patent No.: US 9,182,448 B2
(45) Date of Patent: Nov. 10, 2015

(54) SECONDARY BATTERY, INSPECTION APPARATUS AND INSPECTION METHOD FOR SECONDARY BATTERY, AND BATTERY INSPECTION SYSTEM

(75) Inventor: Yukinari Tanabe, Okazaki (JP)

(73) Assignee: TOYOTA JIDOSHA KABUSHIKI KAISHA, Aichi (JP)

( * ) Notice: Subject to any disclaimer, the term of this patent is extended or adjusted under 35 U.S.C. 154(b) by 212 days.

(21) Appl. No.: 13/701,687

(22) PCT Filed: Jun. 4, 2010

(86) PCT No.: PCT/JP2010/059510
§ 371 (c)(1),
(2), (4) Date: Dec. 3, 2012

(87) PCT Pub. No.: WO2011/151918
PCT Pub. Date: Dec. 8, 2011

(65) Prior Publication Data
US 2013/0069662 A1  Mar. 21, 2013

(51) Int. Cl.
*G01V 3/08* (2006.01)
*G01R 31/36* (2006.01)
*H01M 10/48* (2006.01)
*H02J 7/00* (2006.01)

(52) U.S. Cl.
CPC .......... *G01R 31/362* (2013.01); *G01R 31/3658* (2013.01); *H01M 10/482* (2013.01); *H02J 7/0021* (2013.01); *Y02T 10/7055* (2013.01)

(58) Field of Classification Search
CPC .......................... G01R 31/362; G01R 31/3628
USPC ................................................ 324/434–436
See application file for complete search history.

(56) References Cited

U.S. PATENT DOCUMENTS

| | | | | |
|---|---|---|---|---|
| 5,214,385 A | * | 5/1993 | Gabriel et al. | 324/434 |
| 5,705,914 A | * | 1/1998 | Morita | 340/636.17 |
| 5,804,944 A | * | 9/1998 | Alberkrack et al. | 320/163 |
| 6,100,663 A | * | 8/2000 | Boys et al. | 320/108 |
| 6,278,280 B1 | * | 8/2001 | Horie et al. | 324/436 |

(Continued)

FOREIGN PATENT DOCUMENTS

| | | | |
|---|---|---|---|
| DE | 2846111 A | * | 7/1979 |
| JP | 1-33787 B2 | | 7/1989 |

(Continued)

OTHER PUBLICATIONS

International Search Report for PCT/JP2010/059510 dated Sep. 7, 2010.

*Primary Examiner* — Drew A Dunn
*Assistant Examiner* — Zixuan Zhou
(74) *Attorney, Agent, or Firm* — Sughrue Mion, PLLC

(57) ABSTRACT

A plurality of detection units are connected respectively in parallel with a plurality of battery cells connected in series. The detection units each include an inductor and a zener diode connected in series. A battery checker includes a plurality of detection inductors and a single voltmeter that form a closed circuit. A plurality of detection inductors are arranged so that they are magnetically coupled respectively with the inductors of the plurality of detection units. Each zener diode is connected with the polarity to be reverse biased by the output voltage of the battery cell. Respective breakdown voltages of the zener diodes are set higher than the output voltage of each battery cell in normal use and different in a stepwise manner from each other.

17 Claims, 10 Drawing Sheets

(56) References Cited

U.S. PATENT DOCUMENTS

2003/0151389 A1* 8/2003 Cummings .................. 320/122
2010/0110598 A1* 5/2010 Hyun et al. ................. 361/93.9
2010/0283433 A1* 11/2010 Oh et al. ..................... 320/162

FOREIGN PATENT DOCUMENTS

| JP | 8-79978 A | 3/1996 |
| JP | 11-329507 A | 11/1999 |

* cited by examiner

SECONDARY BATTERY, INSPECTION APPARATUS AND INSPECTION METHOD FOR SECONDARY BATTERY, AND BATTERY INSPECTION SYSTEM

CROSS REFERENCE TO RELATED APPLICATIONS

This application is a National Stage of International Application No. PCT/JP2010/059510 filed Jun. 4, 2010, the contents of which are incorporated herein by reference in their entirety.

TECHNICAL FIELD

The present invention relates to a secondary battery, an inspection apparatus and an inspection method for a secondary battery, and a battery inspection system. More specifically, the invention relates to a technique of detecting, in a battery pack in which a plurality of battery cells are connected in series, an abnormality of the internal resistance on the battery cell basis.

BACKGROUND ART

Whether or not a secondary battery is degraded is commonly determined based on the output voltage of the secondary battery. For example, Japanese Patent Publication No. 1-33787 (PTL 1) discloses that an abnormal state of a battery system is detected based on the battery voltage when the engine is started. Specifically, when the engine is started at a low engine temperature and accordingly the battery voltage decreases, degradation of the performance of the battery is detected. As seen from the above, the battery is commonly inspected based on the output voltage.

CITATION LIST

Patent Literature

PTL 1: Japanese Patent Publication No. 1-33787

SUMMARY OF INVENTION

Technical Problem

Recently, in order to secure the output voltage and the stored electric power, a secondary battery in the form of a battery pack in which a plurality of battery cells are connected has become increasingly used. For example, as a power source for driving a motor in an electrically-driven vehicle such as electric vehicle or hybrid vehicle, a secondary battery in which a plurality of battery cells are connected in series is used. The battery pack as a whole is expensive, and it is therefore preferable to make a cost-saved battery replacement by replacing only a degraded part of a plurality of battery cells that constitute the battery pack.

In order to make a battery replacement in this way, it is necessary to determine, on the battery cell basis, whether or not degradation occurs. In particular, a battery cell having its internal resistance increased due to degradation has to be replaced. As disclosed in PTL 1, it is necessary, for determining whether or not degradation occurs, to evaluate the output voltage of a battery cell when charged/discharged. In view of this, it may simply be considered that the output voltage should be measured on the battery cell basis.

However, due to the configuration of the battery pack, voltage sensors provided respectively for the battery cells will increase the cost. It is therefore preferable to configure the battery pack in such a manner that voltage sensors are arranged respectively for battery blocks or battery modules each made up of a plurality of battery cells and then measure the output voltage of each battery cell by means of a service tool or the like dedicated solely to battery inspection.

In this case as well, if the service tool also requires voltage sensors of the same number as the number of battery cells, the service tool itself will be expensive. Further, since the output voltage of the battery pack is relatively high, the necessity for example of connection between the battery pack and the service tool is not preferred in terms of safety.

The present invention has been made to solve the problems above, and an object of the invention is to safely inspect for degradation (particularly an increase of the internal resistance) on the battery cell basis, in a secondary battery configured in the form of a battery pack in which a plurality of battery cells are connected in series, by means of an inspection apparatus configured at a low cost.

Solution to Problem

According to an aspect of the present invention, a secondary battery includes: a plurality of battery cells connected in series; and a plurality of detection units connected in parallel with the plurality of battery cells respectively. The plurality of detection units each include a reactor and a zener diode connected in series. Each zener diode has a breakdown voltage higher than an output voltage of a corresponding one of the battery cells in use, and respective breakdown voltages of respective zener diodes of the plurality of detection units are designed to have respective values different in a stepwise manner from each other.

Preferably, the plurality of battery cells include first to nth battery cells connected successively, n being an integer of two or more. The plurality of detection units include first to n-th detection units connected in parallel with the first to n-th battery cells respectively. The zener diode in an i-th detection unit has a breakdown voltage lower than the breakdown voltage of the zener diode in an (i+1)-th detection unit, i being an integer of one to (n−1).

More preferably, when the secondary battery is inspected, the secondary battery is supplied with a charging voltage higher than a charging voltage supplied to the secondary battery in use.

Still more preferably, the secondary battery is mounted on a hybrid vehicle. The hybrid vehicle is mounted with a power generation mechanism for generating charging power for the secondary battery, and a control unit controlling the power generation mechanism. When the secondary battery is inspected, the control unit controls the power generation mechanism so that the secondary battery is supplied with constant current larger than an upper limit of charging current for the secondary battery when the hybrid vehicle is being operated.

According to another aspect of the present invention, an inspection apparatus for a secondary battery is provided, and the secondary battery includes: a plurality of battery cells connected in series; and a plurality of detection units connected in parallel with the plurality of battery cells respectively. The plurality of detection units each include a reactor and a zener diode connected in series, the zener diode having a breakdown voltage higher than an output voltage of a corresponding one of the battery cells in use. The inspection apparatus includes: a plurality of detection reactors connected in series; and a voltage detector connected in series with the plurality of detection reactors to constitute a closed circuit. The plurality of detection reactors are each arranged so that, when the inspection apparatus is attached to the secondary battery for inspecting the secondary battery, each detection reactor is magnetically coupled with the reactor in a corresponding one of the plurality of detection units in which respective breakdown voltages of respective zener diodes are designed to have respective values different in a stepwise manner from each other.

Preferably, when the secondary battery is inspected, the secondary battery is supplied with a charging voltage higher than a charging voltage supplied to the secondary battery in use.

More preferably, the secondary battery is mounted on a hybrid vehicle. The hybrid vehicle is mounted with a power generation mechanism for generating charging power for the secondary battery, and a control unit controlling the power generation mechanism. When the secondary battery is inspected, the control unit controls the power generation mechanism so that the secondary battery is supplied with constant current larger than an upper limit of charging current for the secondary battery when the hybrid vehicle is being operated.

According to still another aspect of the present invention, a battery inspection system includes a secondary battery and an inspection apparatus for the secondary battery. The secondary battery includes: a plurality of battery cells connected in series; and a plurality of detection units connected in parallel with the plurality of battery cells respectively. The plurality of detection units each include a reactor and a zener diode connected in series. Each zener diode has a breakdown voltage higher than an output voltage of a corresponding one of the battery cells in use. Respective breakdown voltages of respective zener diodes of the plurality of detection units are designed to have respective values different in a stepwise manner from each other. The inspection apparatus includes: a plurality of detection reactors connected in series; and a voltage detector connected in series with the plurality of detection reactors to constitute a closed circuit. The plurality of detection reactors are each arranged so that, when the inspection apparatus is attached to the secondary battery for inspecting the secondary battery, each detection reactor is magnetically coupled with the reactor in a corresponding one of the plurality of detection units.

Preferably, when the secondary battery is inspected, the secondary battery is supplied with a charging voltage higher than a charging voltage supplied to the secondary battery in use.

More preferably, the secondary battery is housed in a first casing on which a recessed portion is formed. The inspection apparatus is housed in a second casing on which a protruded portion shaped to fit in the recessed portion is formed. Each reactor and each detection reactor are arranged respectively at the recessed portion and the protruded portion so that, when the protruded portion is fit in the recessed portion, the plurality of detection reactors are each magnetically coupled with the reactor in a corresponding one of the plurality of detection units.

Still more preferably, the secondary battery is mounted on a hybrid vehicle. The hybrid vehicle is mounted with a power generation mechanism for generating charging power for the secondary battery, and a control unit controlling the power generation mechanism. When the secondary battery is inspected, the control unit controls the power generation mechanism so that the secondary battery is supplied with constant current larger than an upper limit of charging current for the secondary battery when the hybrid vehicle is being operated.

According to a further aspect of the present invention, an inspection method for a secondary battery including a plurality of battery cells connected in series includes the step of attaching an inspection apparatus to the secondary battery, the inspection apparatus having a closed circuit constituted of a plurality of detection reactors and a voltage detector connected in series, and the secondary battery having a plurality of detection units connected in parallel with the plurality of battery cells respectively. The plurality of detection units each include a reactor and a zener diode connected in series. Each zener diode has a breakdown voltage higher than an output voltage of a corresponding one of the battery cells in use, and respective breakdown voltages of respective zener diodes of the plurality of detection units are designed to have respective values different in a stepwise manner from each other. The plurality of detection reactors are each arranged so that, when the inspection apparatus is attached to the secondary battery, each detection reactor is magnetically coupled with the reactor in a corresponding one of the plurality of detection units. The inspection method further includes the steps of: supplying a charging voltage higher than a charging voltage supplied to the secondary battery in use, to the secondary battery to which the inspection apparatus is attached; measuring a parameter for determining, for each of the plurality of battery cells, whether the battery cell is degraded, based on a voltage waveform at the voltage detector after the test current is applied to the secondary battery; determining whether an abnormal cell having an increased internal resistance is present among the plurality of battery cells, based on the measured parameter; and identifying the abnormal cell among the plurality of battery cells based on the parameter, when it is determined that the abnormal cell is present.

Preferably, the parameter includes the number of steps in which voltage changes in a stepwise manner in the voltage waveform. The step of determining includes the step of determining whether the abnormal cell is present, based on the number of steps.

Preferably, the parameter includes a time width of each voltage step in which voltage changes in a stepwise manner in the voltage waveform. The step of identifying includes the step of identifying the abnormal cell among the plurality of battery cells, based on the time width.

More preferably, the inspection method further includes the steps of: measuring the parameter by the inspection apparatus at the start of use of the secondary battery or when the secondary battery is new; and storing the measured parameter as reference data. The step of determining includes the step of determining whether the abnormal cell is present, based on a comparison between the reference data and the parameter measured when inspection is conducted. The step of identifying includes the step of identifying the abnormal cell among the plurality of battery cells, based on a comparison between the reference data and the parameter measured when inspection is conducted.

Further preferably, the secondary battery is mounted on a hybrid vehicle, and the hybrid vehicle is mounted with a power generation mechanism for generating charging power for the secondary battery. The step of supplying includes the step of controlling the power generation mechanism so that the secondary battery is supplied with constant current larger than an upper limit of charging current for the secondary battery when the hybrid vehicle is being operated.

Preferably, the secondary battery is housed in a first casing on which a recessed portion is formed. The inspection apparatus is housed in a second casing on which a protruded portion shaped to fit in the recessed portion is formed. Each reactor and each detection reactor are arranged respectively at the recessed portion and the protruded portion. In the step of attaching, the protruded portion is fit in the recessed portion to allow the plurality of detection reactors each to be positioned so that the detection reactor is magnetically coupled with the reactor in a corresponding one of the plurality of detection units.

Advantageous Effects of Invention

In accordance with the present invention, an inspection apparatus configured at a low cost can be used to safely inspect for degradation (particularly an increase of the internal resistance) on the battery cell basis, in a secondary battery configured in the form of a battery pack in which a plurality of battery cells are connected in series.

DESCRIPTION OF EMBODIMENTS

First Embodiment

Figure 1:
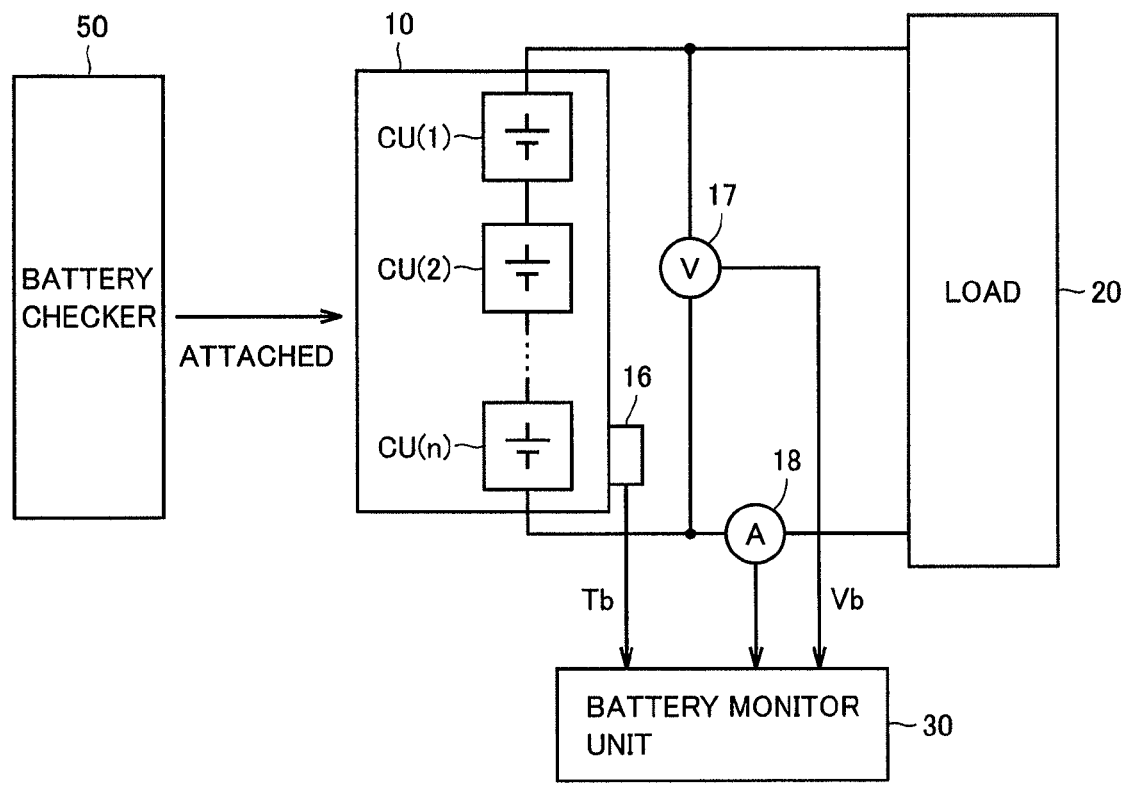
FIG. 1 is a block diagram showing a schematic configuration of an electrical system in which a secondary battery in an embodiment of the present invention is used.

FIG. 1 is a schematic block diagram showing a configuration of an electrical system in which a secondary battery in an embodiment of the present invention is used.

Referring to FIG. 1, a secondary battery 10 in the form of a battery pack includes n (n is an integer of two or more) cell units CU(1) to CU(n). In the following, the cell unit is simply referred to as cell unit CU if the cell units CU(1) to CU(n) are collectively referred to without being distinguished from each other in terms of the order in which the cell units are connected to each other. As described later herein, each cell unit CU includes one battery cell.

Secondary battery 10 is provided with a temperature sensor 16, a voltage sensor 17, and a current sensor 18. Output voltage (battery voltage) Vb of secondary battery 10 is measured by voltage sensor 17. Current sensor 18 measures input/output current (battery current) Ib of secondary battery 10. Temperature sensor 16 measures battery temperature Tb of secondary battery 10. The measured battery data (such as battery voltage Vb, battery current Ib, battery temperature Tb) is sent to a battery monitor unit 30.

A load 20 operates by consuming electric power supplied from secondary battery 10. Alternatively, load 20 may be configured to include a power generation element (not shown) and thereby have an operation mode of generating electric power for charging the secondary battery. For example, load 20 is constituted of a traction motor mounted on an electric vehicle, hybrid vehicle, or the like and an electric power converter (such as inverter) controlling supply of electric power to the motor.

Battery monitor unit 30 is constituted of an electronic control unit (not shown) including components such as microprocessor, memory, analog/digital converter, and digital/analog converter. The electronic control unit is configured to execute a predetermined program stored in advance in the memory to carry out predetermined processing using input signals and data from the sensors for example and generate output signals and data based on the result of processing.

Battery monitor unit 30 monitors the state of secondary battery 10 based on the battery data from sensors 16 to 18 while secondary battery 10 is used, namely during actual operation of the load in which load 20 is driven with electric power supplied from secondary battery 10 or load 20 provides regenerative electric power to charge secondary battery 10.

Secondary battery 10 shown in FIG. 1 is configured in such a manner that the output voltage of each cell unit CU, namely each battery cell, cannot be measured. A battery checker 50, however, can be attached to secondary battery 10 (each cell unit CU) so that degradation (degradation due to an increase of the internal resistance) of each battery cell can be detected. Secondary battery 10 and battery checker 50 are combined to constitute "battery inspection system" of the present invention.

Figure 2:
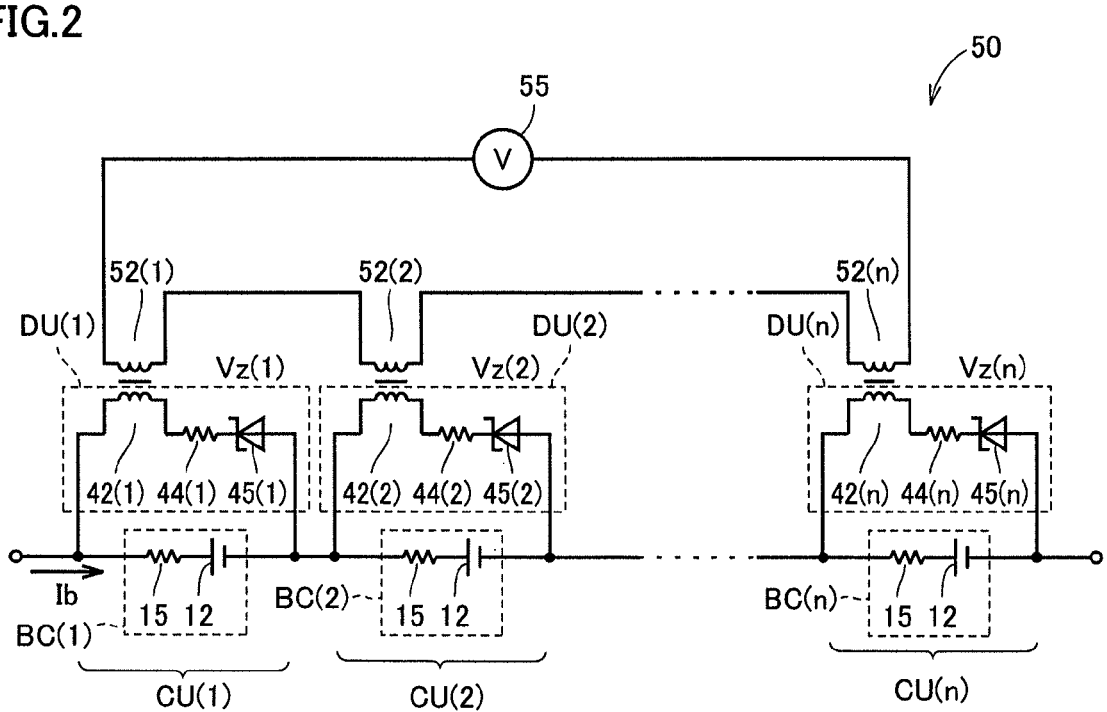
FIG. 2 is an electrical circuit diagram showing a configuration of each cell unit and a service tool shown in FIG. 1.

FIG. 2 is a circuit diagram showing a configuration of each cell unit and the battery checker.

Referring to FIG. 2, each cell unit CU includes a single battery cell BC and a detection unit DU connected in parallel with battery cell BC. Namely, an i-th (i is an integer of one to n) cell unit CU(i) has a battery cell BC(i) and a detection unit DU(i). The subscript (i) added to the reference character of each component herein represents the (first to n-th) place where cell unit CU is located in the sequence of cell units CU connected in series. In the case, however, it is unnecessary to distinguish the cell units from each other in terms of the place where each cell unit is located in the sequence of the cell units, each reference character is indicated without the subscript representing the place in the sequence.

Each battery cell BC is represented by an equivalent circuit in which a voltage source 12 and an internal resistor 15 are connected in series. The output voltage of voltage source 12 corresponds to an open circuit voltage (OCV) of this battery cell BC. When battery cell BC is charged/discharged, its output voltage is commonly referred to as CCV (Closed Circuit Voltage). When the cell is charged/discharged, battery current Ib causes a voltage drop to occur to internal resistor 15, and thus the CCV is higher (when the cell is charged) or lower (when the cell is discharged) than the OCV.

Here, detection unit DU has an inductor 42, a current limiting resistor 44, and a zener diode 45 connected in series to each other. Zener diode 45 is connected with the polarity in the direction to be reverse biased by battery cell BC.

Therefore, when the output voltage of battery cell BC exceeds breakdown voltage Vz of zener diode 45, zener diode 45 is rendered electrically conductive. Current limiting resistor 44 is a circuit's protective resistor for limiting the current flowing in zener diode 45 at this time. Namely, the value of the resistance of current limiting resistors 44(1) to 44(n) is adjusted in accordance with allowable electric power of zener diodes 45(1) to 45(n).

When secondary battery 10 is used, the charging current (battery current Ib) and/or the charging voltage are defined within a predetermined range. In other words, the operation of load 20 is restricted so that the charging current and/or the charging voltage will not exceed a predetermined upper limit. Thus, respective breakdown voltages Vz(1) to Vz(n) of zener diodes 45(1) to 45(n) are designed so that they are higher than the output voltage (CCV) of battery cells BC(1) to BC(n) when the upper-limit charging current in use flows in each battery cell BC or when the cell is charged with a normal charging voltage.

Further, breakdown voltages Vz(1) to Vz(n) are set to respective values different from each other in a stepwise manner. In the present embodiment, preferably breakdown voltages Vz(1) to Vz(n) are set, like Vz(1)<Vz(2)< . . . <Vz(n), so that the breakdown voltages are arranged in a stepwise manner and in the ascending order in accordance with the order in which cell units CU are connected.

Battery checker 50 includes detection inductors 52(1) to 52(n) and a voltage detector 55 connected in series to form a closed circuit. Detection inductors 52(1) to 52(n) are arranged to be magnetically coupled with inductors 42(1) to 42(n) respectively in respective detection units DU(1) to DU(n) when battery checker 50 is attached to secondary battery 10.

Voltage detector 55 is understood to be connected to detect the sum of induced voltages generated in detection inductors 52(1) to 52(n). Voltage detector 55 is configured to be capable of measuring a time change of the detected voltage, namely the voltage waveform. For example, voltage detector 55 is constituted of an oscilloscope.

When battery checker 50 is attached to secondary battery 10 to inspect the secondary battery, battery cells BC(1) to BC(n) are charged with a charging voltage higher than that in normal use, so that the output voltage (CCV) of each battery cell BC is higher than that in normal use. Consequently, battery cells BC(1) to BC(n) connected in series are supplied with the test charging current (test current It) that is higher than the upper limit of the charging current for secondary battery 10 in use.

Specifically, the charging condition (charging voltage and/or charging current) for the inspection of the secondary battery is defined so that, while the CCV of battery cell BC(i) is lower than breakdown voltage Vz(i) of zener diode 45(i) when the normal operation is done, it is higher than breakdown voltage Vz(i) when the inspection is conducted.

When the CCV of battery cell BC(i) exceeds breakdown voltage Vz(i) of zener diode 45(i), zener diode 45(i) is rendered electrically conductive. Accordingly, current flows in detection unit DU(i) and an induced voltage is generated in inductor 42(i). The induced voltage generated in inductor 42(i) appears in corresponding detection inductor 52(i) due to the magnetic coupling. The induced voltage appearing in detection inductor 52(i) appears in voltage detector 55. Therefore, voltage Vck measured by voltage detector 55 increases with the number of cell units CU in which respective zener diodes 45 are rendered electrically conductive.

Here, common charging current flows in battery cells BC(1) to BC(n) connected in series. Therefore, if respective internal resistances of battery cells BC are substantially equal to each other (namely normal), zener diodes 45(1) to 45(n) are rendered electrically conductive successively in accordance with the difference between breakdown voltages Vz(1) to Vz(n). In contrast, if any battery cell has an increased resistance value of internal resistor 15, the CCV of this battery cell is higher than that in the normal state, and thus zener diodes 45(1) to 45(n) are rendered electrically conductive differently from the normal state. It is thus understood that the waveform of voltage Vck is different between the normal state and the state in which an abnormality occurs.

Next, FIGS. 3 to 6 are used to describe the results of a simulation of an inspection of the secondary battery in the embodiment of the present invention.

Figure 3:
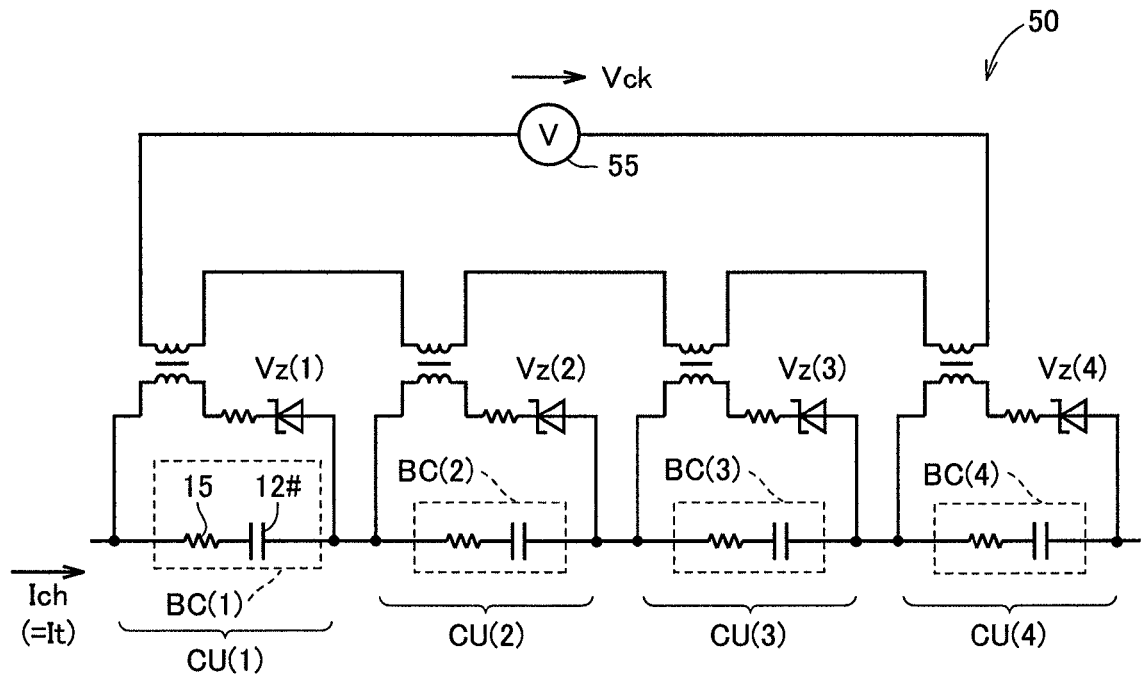
FIG. 3 is a circuit diagram illustrating conditions for a simulation of an inspection of a secondary battery in an embodiment of the present invention.

FIG. 3 is a circuit diagram illustrating conditions for a simulation of an inspection of the secondary battery in the embodiment of the present invention.

Referring to FIG. 3, secondary battery 10 to be inspected is made up of four cell units CU(1) to CU(4) connected in series. When the inspection is conducted, secondary battery 10 is charged. Thus, in each cell unit CU, internal resistor 15 and capacitor 12# are connected in series to constitute battery cell BC. The conditions for the simulation include an internal resistance of a normal cell of 3 mΩ and an internal resistance of an abnormal cell of 6 mΩ. Capacitor 12# is 4000 F.

For each battery cell BC, detection unit DU shown in FIG. 2 is disposed. The conditions for the simulation include a breakdown voltage Vz(1) of 4.0 V and respective breakdown voltages of Vz(2), Vz(3), and Vz(4) that are each set higher by 0.01 V than the preceding one.

Figure 5:
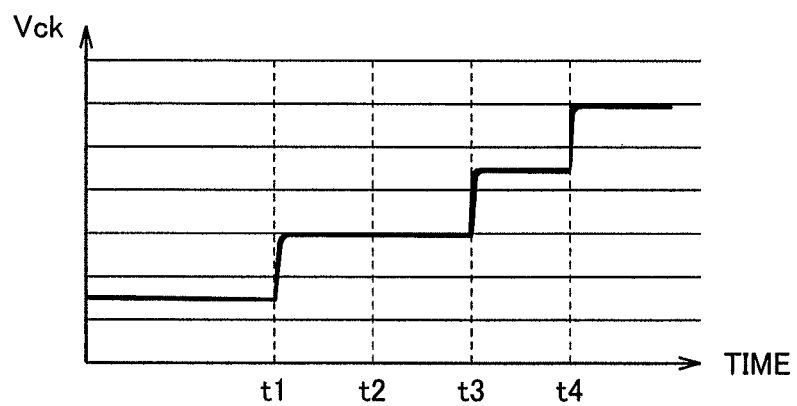
FIG. 5 is a second waveform diagram (abnormal operation 1) showing a simulation result for the circuit in FIG. 3.
Figure 6:
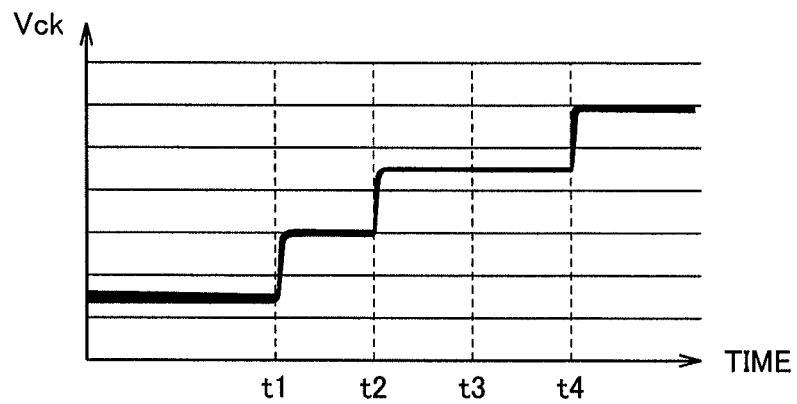
FIG. 6 is a third waveform diagram (abnormal operation 1) showing a simulation result for the circuit in FIG. 3.

The circuit shown in FIG. 3 is charged for inspecting the secondary battery under the condition that test current It=60 A is supplied as a constant charging current Ich. When such test current is supplied, battery checker (voltage detector 55) measures the waveform of voltage Vck. The results of the simulation of the waveform are shown in FIGS. 4 to 6.

Figure 4:
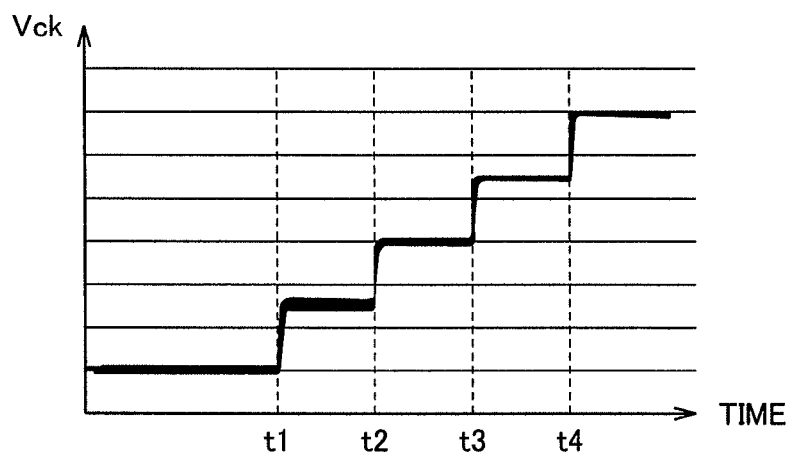
FIG. 4 is a first waveform diagram (normal operation) showing a simulation result for the circuit in FIG. 3.

FIG. 4 is a waveform diagram showing a simulation result in the case where respective internal resistances of the battery cells are normal. Namely, FIG. 4 shows the result of the simulation of the waveform of voltage Vck in the case where the internal resistance of each battery cell BC is 3 mΩ.

Referring to FIG. 4, when respective internal resistances of battery cells BC are normal, respective output voltages (CCV) of the battery cells increase similarly to each other. Therefore, in the order of cell units CU(1) to CU(4), the output voltage of battery cell BC exceeds breakdown voltage Vz of zener diode 45 to cause the voltage to be generated in inductor 42 and detection inductor 52.

Specifically, at time t1, zener diode 45(1) in cell unit CU(1) is rendered conductive. At time t2, zener diode 45(2) in cell unit CU(2) is rendered conductive. At time t3, zener diode 45(3) in cell unit CU(3) is rendered conductive. At time t4, zener diode 45(4) in cell unit CU(4) is rendered conductive.

As a result, voltage Vck has its waveform indicating stepwise increases at time t1 to t4 respectively. Namely, voltage Vck increases in four steps which is the same number as the number of cell units CU (battery cells BC). Further, the time widths between adjacent voltage steps are almost equal to each other.

FIG. 5 shows a simulation result in the case where the internal resistance of battery cell BC(2) has increased. Namely, there is shown the result of the simulation of voltage Vck in the case where the internal resistance of battery cell BC(2) is 6 mΩ and the internal resistance of the remaining battery cells BC(1), BC(3), and BC(4) is 3 mΩ.

Referring to FIG. 5, regarding cell unit CU(2) containing battery cell BC(2) having the increased internal resistance, the output voltage (CCV) of this cell unit increases at a timing earlier than that shown in FIG. 4. Consequently, at time t1, zener diodes 45(1), 45(2) of cell units CU(1), CU(2) are rendered conductive. At time t3 and time t4, respective output voltages of cell units CU(3) and CU(4) exceed breakdown voltages Vz(3) and Vz(4) respectively, which is similar to FIG. 4. As a result, due to the presence of the battery cell having the increased internal resistance, the number of steps in which the voltage increases in a stepwise manner (hereinafter also simply referred to as "the number of steps") is smaller by one relative to FIG. 4. Further, the time widths between the voltage steps are not uniform. Specifically, the time width (from time t1 to time t3) of the first voltage step is longer than the time width (from time t3 to time t4) of the second voltage step.

FIG. 6 shows a simulation result in the case where the internal resistance of battery cell BC(3) has increased. Namely, there is shown the result of the simulation of voltage Vck in the case where battery cell BC(3) has the internal resistance of 6 mΩ and the remaining battery cells BC(1), BC(2), BC(4) have the internal resistance of 3 mΩ.

Referring to FIG. 6, regarding cell unit CU(3) containing battery cell BC(3) having the increased internal resistance, the output voltage (CCV) of this cell unit increases at a timing earlier than that shown in FIG. 4. Consequently, at time t2, zener diodes 45(2), 45(3) of cell units CU(2), CU(3) are rendered conductive. At time t1 and time t4, respective output voltages of cell units CU(1) and CU(4) exceed breakdown voltages Vz(1) and Vz(4) respectively, which is similar to FIG. 4.

As a result, due to the presence of the battery cell having the increased internal resistance, the number of steps in which the voltage increases in a stepwise manner (hereinafter also simply referred to as "the number of steps") is smaller by one relative to FIG. 4. Further, the time widths between the voltage steps are not uniform. Specifically, the time width (from time t2 to time t4) of the second voltage step is longer than the time width (from time t1 to time t2) of the first voltage step.

It is understood from the results of the simulation in FIGS. 4 to 6 that the presence of an abnormal cell having the increased internal resistance in the secondary battery of the present embodiment appears on the waveform of voltage Vck at battery checker 50.

Figure 7:
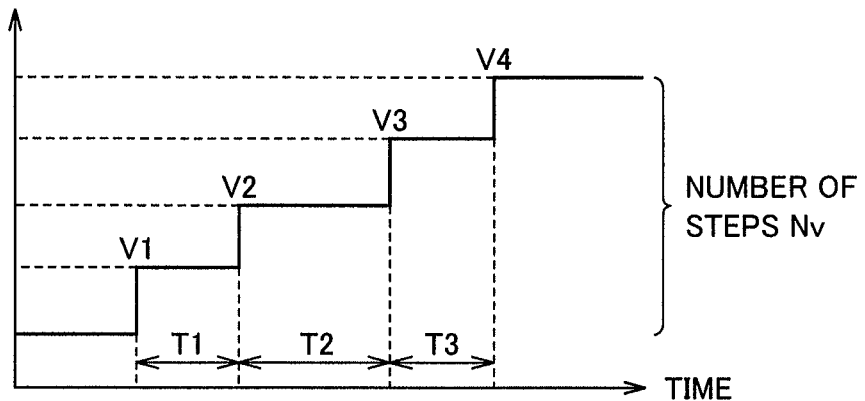
FIG. 7 is a conceptual diagram illustrating parameters for evaluation of the voltage waveform measured by a battery checker.

Therefore, parameters for evaluation of the voltage waveform measured by the battery checker can be defined as shown in FIG. 7.

Referring to FIG. 7, the evaluation parameters include the number of steps Nv of the voltage that changes in a stepwise manner, and time widths T1 to T3 (hereinafter also referred to collectively as "time width Ti") of intermediate voltage steps respectively. Namely, the evaluation parameter (reference data) in a reference state in which the internal resistance of each battery cell BC is normal (typically when the battery is new or at the start of use of the battery) is compared with the evaluation parameter taken when the inspection is done. Accordingly, the abnormality (the increase of the internal resistance) can be detected on the battery cell basis.

Specifically, depending on whether or not the number of steps Nv is decreased, it can be determined whether or not there is a battery cell (abnormal cell) that is degraded due to the increased internal resistance. Further, when the abnormal cell is found, the abnormal cell can be identified based on a change in time width Ti from the reference state.

Figure 8:
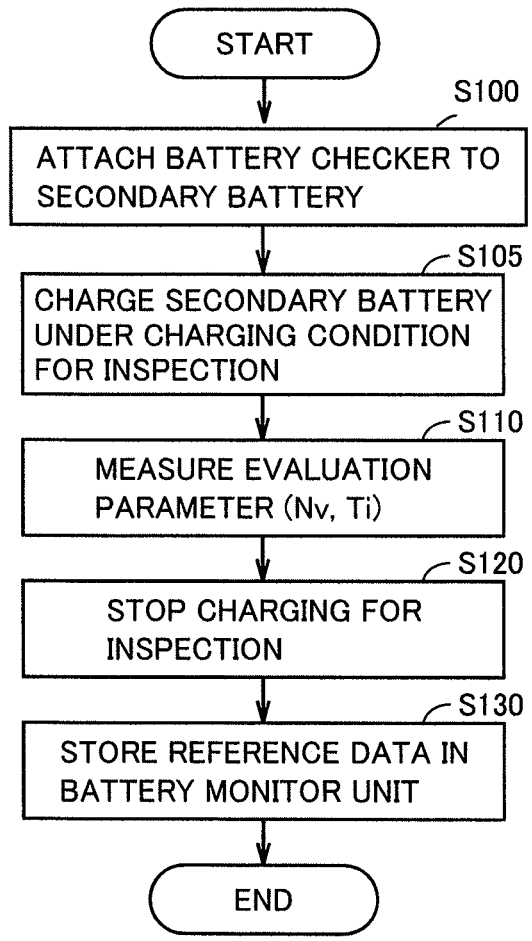
FIG. 8 is a flowchart showing a process procedure followed when reference data of the secondary battery in the present embodiment is measured.

FIG. 8 shows a process procedure followed when the reference data of the secondary battery is measured in the present embodiment. The flowchart shown in FIG. 8 can for example be executed when the battery is new or at the start of use of the battery.

Referring to FIG. 8, in step S100, battery checker 50 is attached to secondary battery 10. In step S105, secondary battery 10 to which battery checker 50 is attached is charged for the sake of inspection. Namely, secondary battery 10 is charged under the charging condition (charging voltage or charging current) so that the CCV of battery cell BC(i) is higher than breakdown voltage Vz(i) of zener diode 45(i) in the normal state. For example, a charger or the like having the regulator capability may be used to execute step S105.

In step S110, in the state where the battery is charged for the sake of inspection, the voltage waveform (Vck) at battery checker 50 (voltage detector 55) is observed. Based on the voltage waveform, the number of steps Nv of the voltage and time width Ti between the voltage steps that are evaluation parameters illustrated in FIG. 7 are measured. Here, the number of steps Nv and time width Ti may also be measured automatically by means of the voltage waveform analysis capability for example.

When the evaluation parameters have been measured in step S110, step S120 is executed to stop charging secondary battery 10, which has been done for the sake of inspection. Further, in step S130, the evaluation parameters obtained in step S110 are stored as reference data in battery monitor unit 30 in FIG. 1. Thus, even after secondary battery 10 is used, access may be made to battery monitor unit 30 to read the initial state data at any timing.

Figure 9:
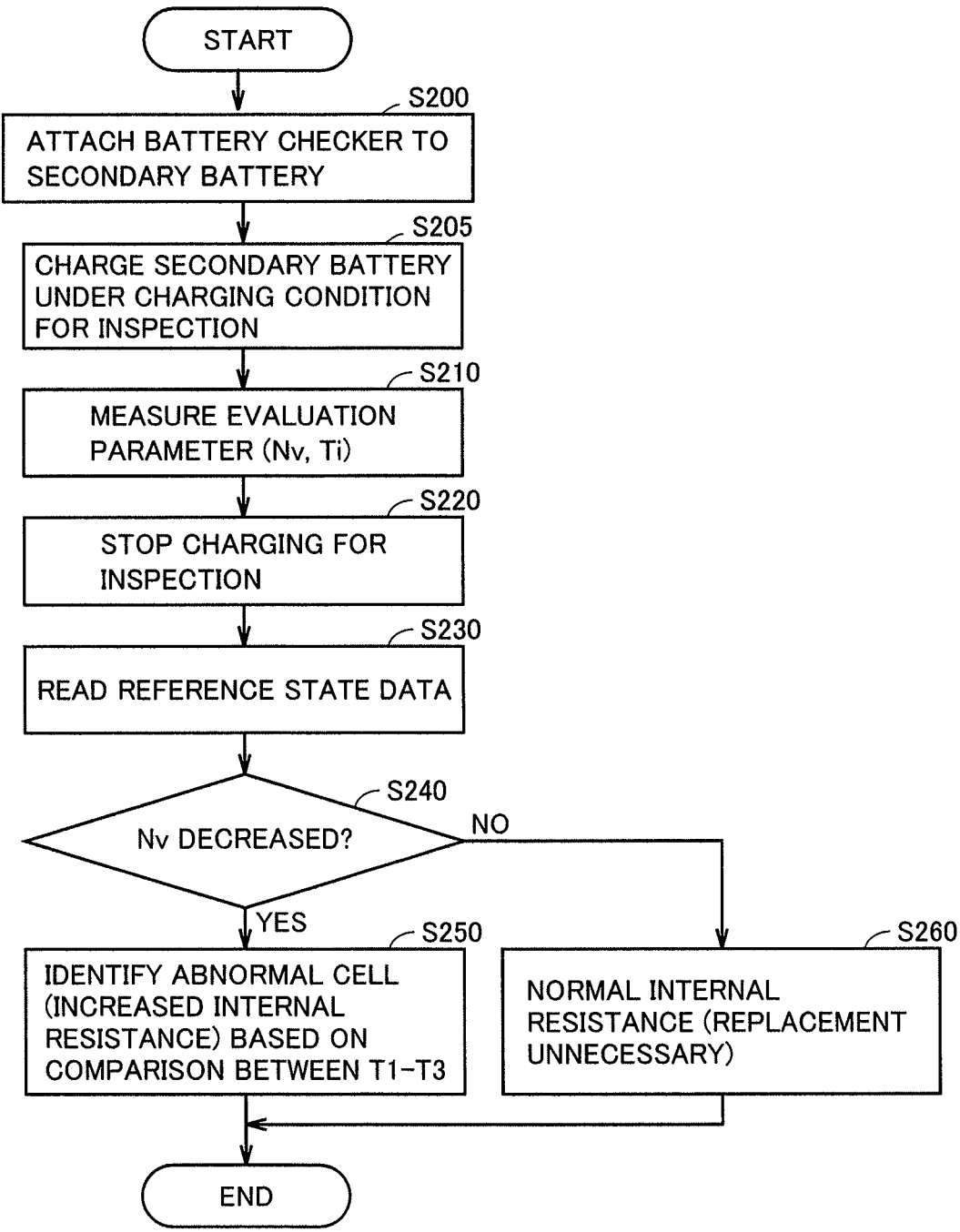
FIG. 9 is a flowchart showing a process procedure followed when the secondary battery in the present embodiment is inspected.

FIG. 9 is a flowchart showing a process procedure followed when secondary battery 10 is inspected in the present embodiment.

Referring to FIG. 9, in steps S200 to S205, battery checker 50 is attached to secondary battery 10 and secondary battery 10 is charged for the sake of inspection, as done in steps S100 to S105 in FIG. 8. At this time, preferably the charging condition (charging voltage or charging current) is substantially identical to that of step S105. Alternatively, the charging condition under which the reference data is measured may be stored together with the reference data in battery monitor unit 30, so that the charging condition for the inspection can surely be made substantially identical to that when the reference data was measured.

In step S210, in the state where the battery is charged for the sake of inspection, based on the waveform of voltage Vck obtained by battery checker 50 (voltage detector 55), evaluation parameters, namely the number of steps Nv of the voltage and time width Ti between the voltage steps are measured. After the evaluation parameters have been measured in step S210, step S220 is executed to stop charging secondary battery 10, which has been done for the sake of inspection.

In step S230, as reference data of secondary battery 10, the evaluation parameters in the reference state (when the battery is new or at the start of use of the battery) are read. Here, the process in step S230 may be performed prior to steps S200 to S220.

In step S240, a comparison is made between the number of steps Nv of the voltage, which is one of the evaluation parameters, of the reference data and that of the measurement data obtained this time for the sake of inspection. When the number of steps Nv is equal to the number of steps Nv of the reference data (NO in step S240), it is determined in step S260 that the internal resistance of each battery cell BC is normal, namely all battery cells BC (namely all cell units CU) require no replacement.

In contrast, when the number of steps Nv is smaller than that of the reference data (YES in step S240), it is determined that there is an abnormal cell having its internal resistance increased. In this case, the process proceeds to step S250 in which a comparison of time width Ti is made between the reference data and the present data measured for the sake of inspection, to thereby identify the abnormal cell. As a result, battery cell BC(i) (namely cell unit CU(i)) that must be replaced can be identified.

Thus, the secondary battery of the present embodiment is charged under the charging condition for inspection, in such a manner that zener diode 45, which is not rendered conductive in normal use, is rendered conductive. Accordingly, from detection unit DU including inductor 42 and zener diode 45, the voltage corresponding to the output voltage of each battery cell BC can be read through magnetic coupling. Namely, secondary battery 10 is configured so that the voltage of each cell unit CU of the battery pack can be externally measured by means of the magnetic coupling between the inductors.

Battery checker 50 utilizes the magnetic coupling between the inductors to measure the output voltage of each cell unit CU by means of detection inductor 42. In particular, a voltage change (voltage waveform) at one voltage detector 55 can be used to detect degradation (particularly an increase of the internal resistance) on the battery cell BC basis.

Consequently, without voltage sensors provided respectively for battery cells BC of the battery pack (secondary battery 10), battery checker 50 having one voltage detector 55 can be used to detect degradation (particularly an increase of the internal resistance) on the battery cell basis. Namely, both the battery pack (secondary battery 10) and battery checker 50 which is the inspection tool can be configured at a low cost to detect degradation on the battery cell basis.

Further, secondary battery 10 and battery checker 50 are configured in such a manner that magnetic coupling is used to perform non-contact measurement through magnetic coupling. Thus, operations such as disassembly of the battery pack and connection of the voltage sensor for example are unnecessary, and secondary battery 10 can thus be inspected safely.

Figure 10:
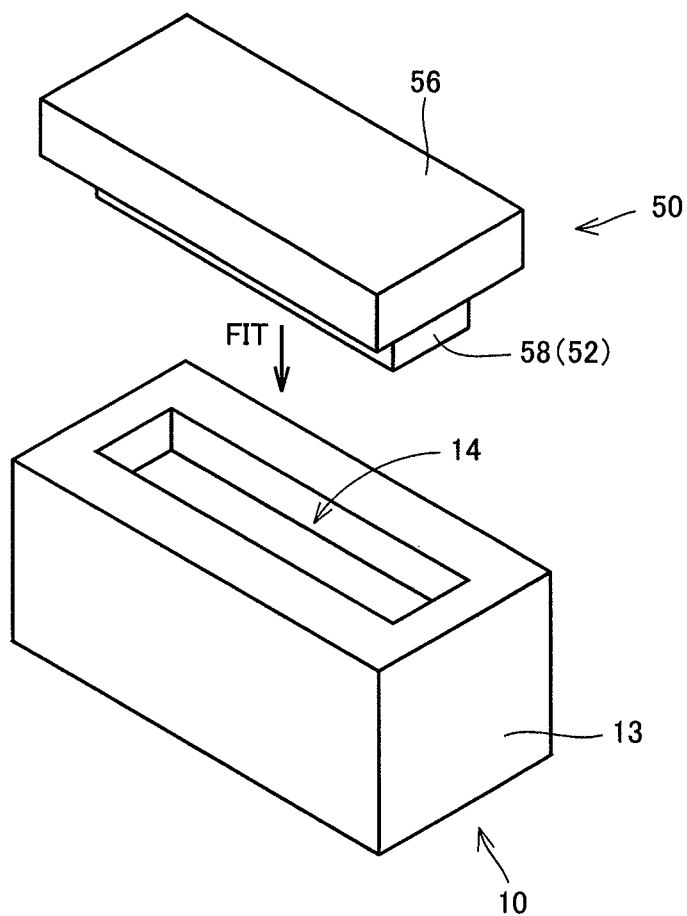
FIG. 10 is a schematic diagram illustrating an example of the external form of the secondary battery and the battery checker in the present embodiment.
Figure 11:
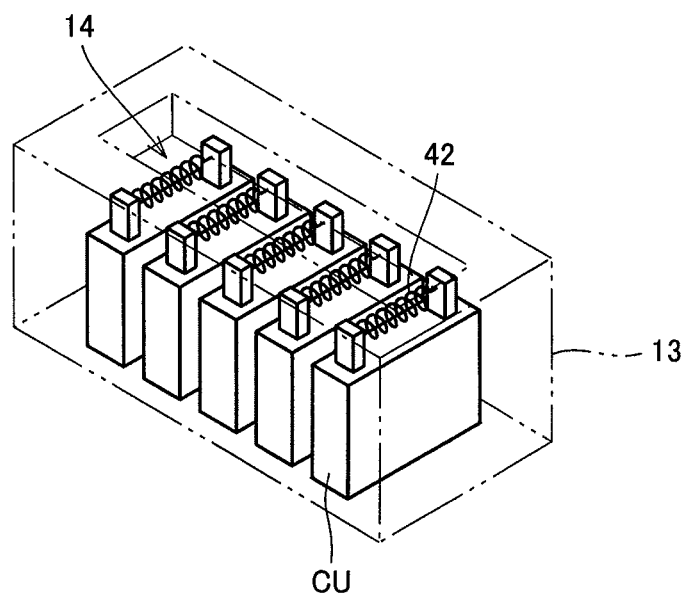
FIG. 11 is a perspective view schematically showing an internal configuration of the secondary battery shown in FIG. 9.

FIGS. 10 and 11 show an example of the external form of the secondary battery (battery pack) and the battery checker for further facilitating inspection of the secondary battery.

Referring to FIG. 10, secondary battery 10 in the form of a battery pack is housed in a casing 13. Likewise, battery checker 50 is housed in a casing 56. Casings 13, 56 are each made of an insulator such as resin. On casing 13 of the secondary battery, a recessed portion 14 is provided. Casing 56 of battery checker 50 is configured to have a protruded portion 58 which fits in recessed portion 14 of casing 13.

Referring to FIG. 11, cell units CU are arranged in casing 13. Inductors 42 included in the detection units of cell units CU respectively are arranged in the vicinity of recessed portion 14. For example, inductors 42(1) to 42(n) are arranged in order, in a region corresponding to the bottom surface of recessed portion 14.

Referring again to FIG. 10, in protruded portion 58 of battery checker 50, detection inductors 52(1) to 52(n) shown in FIG. 3 are arranged. Specifically, detection inductors 52(1) to 52(n) are housed in protruded portion 58 in the state where detection inductors 52(1) to 52(n) are positioned in advance so that, when protruded portion 58 of battery checker 50 is fit in recessed portion 14 of secondary battery 10, the detection inductors 52(1) to 52(n) are magnetically coupled respectively with inductors 42(1) to 42(n) provided in the region corresponding to recessed portion 14.

Accordingly, casings 13, 56 of secondary battery 10 and battery checker 50 are fit with each other to thereby position both inductors 42(1) to 42(n) of the secondary battery and detection inductors 52(1) to 52(n) of battery checker 50 so that they are magnetically coupled with each other appropriately.

Second Embodiment

In connection with a second embodiment, a description will be given of the case where secondary battery 10 to be inspected is mounted on a hybrid vehicle. The hybrid vehicle is mounted with a power generation mechanism for charging secondary battery 10 while the vehicle is traveling. Thus, in the second embodiment, the charging power to be used when the reference data is measured and when the inspection is conducted is generated by the power generation mechanism mounted on the vehicle.

Figure 12:
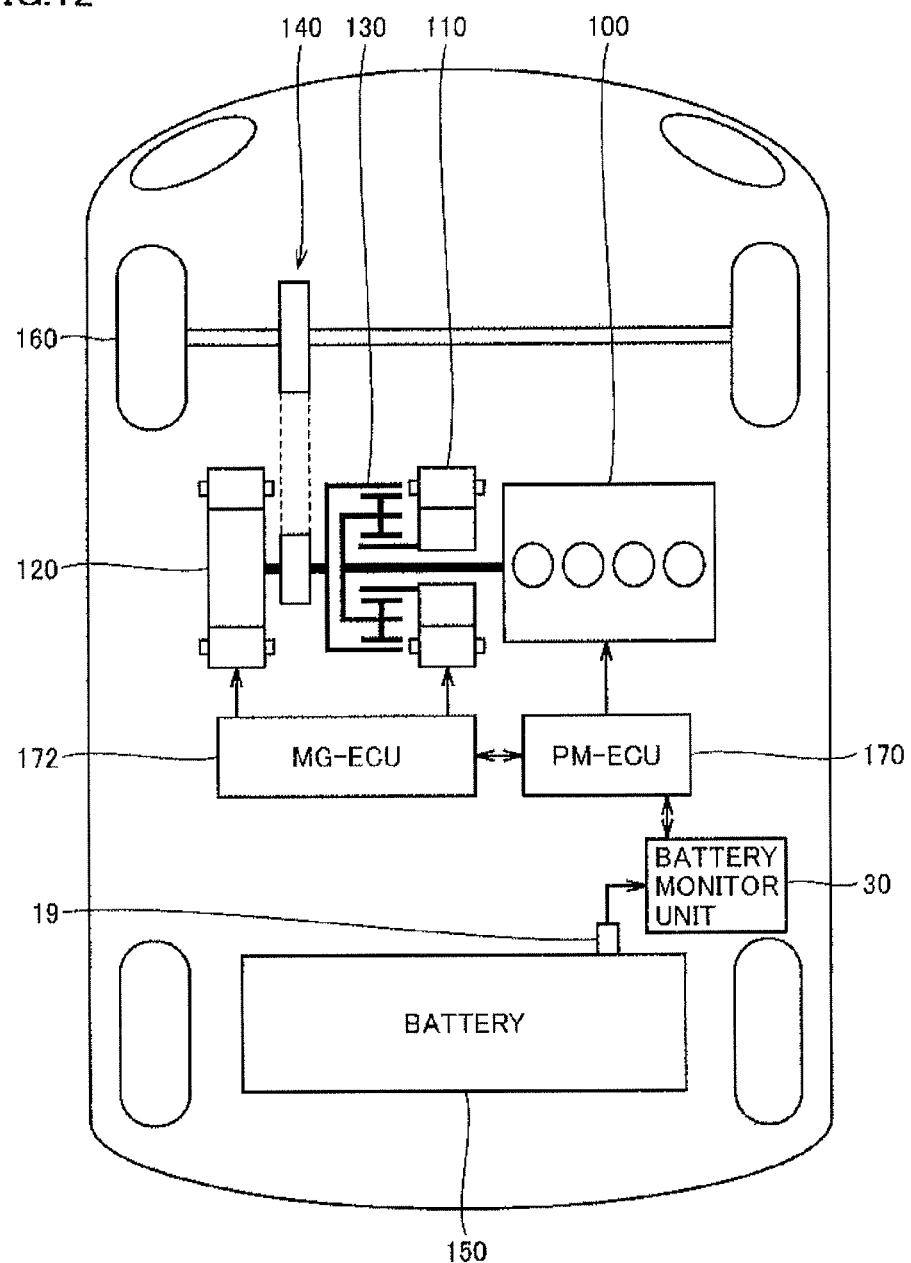
FIG. 12 is a block diagram showing an example of the configuration of a hybrid vehicle mounted with the secondary battery in the present embodiment.

Referring to FIG. 12, a hybrid vehicle mounted with the secondary battery in the present embodiment will be described. This hybrid vehicle includes an engine 100, a first MG (Motor Generator) 110, a second MG 120, a power split device 130, a reduction gear 140, and a battery 150.

The hybrid vehicle is caused to travel by a drive force from at least one of engine 100 and second MG 120. Engine 100, first MG 110, and second MG 120 are coupled through power split device 130. The motive power generated by engine 100 is split by power split device 130 into two paths. One is a path for driving front wheels 160 through reduction gear 140, and the other is a path for driving first MG 110 and thereby generating electric power.

First MG 110 is a three-phase AC rotating electric machine including a U phase coil, a V phase coil, and a W phase coil. First MG 110 generates electric power from the drive force of engine 100 split by power split device 130. The electric power generated by first MG 110 is used as appropriate depending on the state in which the vehicle is traveling and the SOC (State Of Charge) of battery 150. For example, in the case of normal travel, the electric power generated by first MG 110 is directly used for driving second MG 120. In contrast, when the SOC of battery 150 is smaller than a predetermined value, the electric power generated by first MG 110 is converted by an inverter described later herein from AC into DC. After this, the voltage is adjusted by a converter described later herein and stored in battery 150.

Second MG 120 is a three-phase AC rotating electric machine including a U phase coil, a V phase coil, and a W phase coil. Second MG 120 is driven by at least one of the electric power stored in battery 150 and the electric power generated by first MG 110.

The drive force of second MG 120 is transmitted through reduction gear 140 to front wheels 160. Thus, second MG 120 assists engine 100 or causes the vehicle to travel with the drive force from second MG 120. Instead of or in addition to front wheels 160, the rear wheels may be driven.

When the hybrid vehicle is regeneratively braked, second MG 120 is driven by front wheels 160 through reduction gear 140, and second MG 120 operates as an electric generator. Thus, second MG 120 operates as a regenerative brake converting the braking energy into electric power. The electric power generated by second MG 120 is stored in battery 150.

For controlling first MG 110 and second MG 120, PWM (Pulse Width Modulation) control for example is used. Here, as a method for controlling first MG 110 and second MG 120 by means of the PWM control, a well-known and common technique may be used. Therefore, the further detailed description will not be repeated here.

Power split device 130 is a planetary gear unit including a sun gear, a pinion gear, a carrier, and a ring gear. The pinion gear meshes with the sun gear and the ring gear. The carrier supports the pinion gear so that the pinion gear can rotate about its axis. The sun gear is coupled to the rotational shaft of first MG 110. The carrier is coupled to the crankshaft of engine 100. The ring gear is coupled to the rotational shaft of second MG 120 and reduction gear 140.

Figure 13:
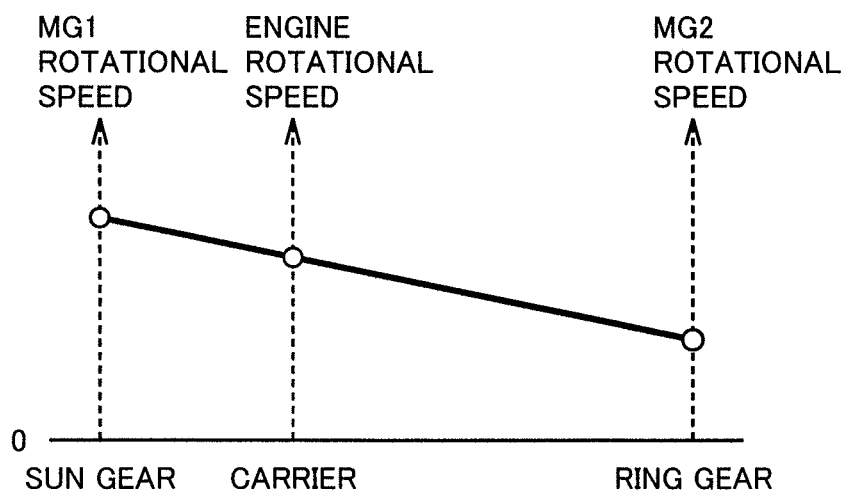
FIG. 13 is a nomographic chart showing a relation in rotational speed between the engine and MG of the hybrid vehicle shown in FIG. 12.

Engine 100, first MG 110, and second MG 120 are coupled through the planetary gear unit, and accordingly, the rotational speeds of engine 100, first MG 110, and second MG 120 have a relation as shown in FIG. 13 in which they are connected by a straight line in a nomographic chart.

Referring again to FIG. 12, battery 150 corresponds to secondary battery 10 shown in FIG. 1. Namely, battery 150 corresponds to the secondary battery in the present embodiment, and battery checker 50 can be attached to the battery to detect an abnormality (an increase of the internal resistance) on the battery cell basis. Battery 150 has a voltage for example of approximately 200 V. On battery 150, a battery sensor 19 is placed. Battery sensor 19 collectively represents temperature sensor 16, voltage sensor 17, and current sensor 18 in FIG. 1. Battery data detected by battery sensor 19 is sent to battery monitor unit 30.

A PM (Power train Manager)-ECU (Electronic Control Unit) 170 generally controls the operations of engine 100, first MG 110, and second MG 120. PM-ECU 170 sets a target value of the output torque and/or the rotational speed of engine 100, first MG 110, and second MG 120, so that the hybrid vehicle runs in accordance with the driver's operation. Engine 100 is controlled by an engine ECU (not shown), in accordance with a command from PM-ECU 170.

First MG 110 and second MG 120 are controlled by an MG-ECU 172 in accordance with a command from PM-ECU 170. For example, PM-ECU 170 sets a torque command value for first MG 110 and second MG 120. In accordance with the torque command value from PM-ECU 170, MG-ECU 172 controls the output torque of first MG 110 and second MG 120 based on feedback of the electric current.

Figure 14:
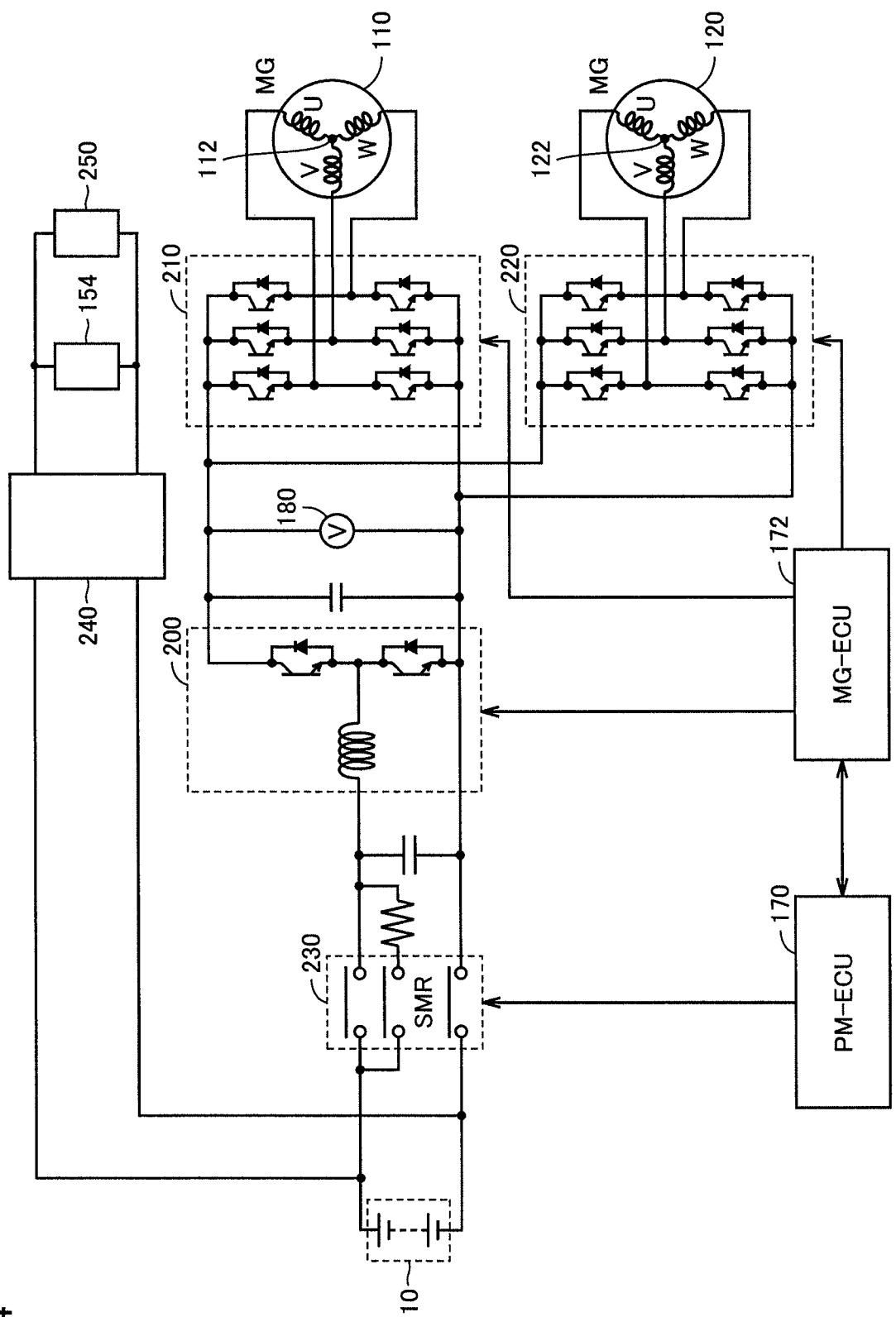
FIG. 14 is a configuration diagram of an electrical system in FIG. 12.

FIG. 14 will be used to further describe an electrical system of the hybrid vehicle. In the hybrid vehicle, a converter 200, a first inverter 210, a second inverter 220, an SMR (System Main Relay) 230, a DC/DC converter 240, and an auxiliary 250 are provided.

Converter 200 includes a reactor, two npn transistors, and two diodes. The reactor has one end connected to the positive side of battery 150. The reactor has the other end connected to the point of connection of two power semiconductor switching devices (herein also referred to as "switching device") connected in series.

The npn transistors are controlled by MG-ECU 172. Between the collector and the emitter of each npn transistor, the diode is connected for allowing current to flow from the emitter side to the collector side.

Here, as the switching device, instead of the illustrated power transistor (npn transistor), an IGBT (Insulated Gate Bipolar Transistor), a power MOSFET (Metal Oxide Semiconductor Field-Effect Transistor), or the like may be used as appropriate.

When the electric power discharged from battery 150 is to be supplied to first MG 110 or second MG 120, the voltage is stepped up by converter 200. On the contrary, when the electric power generated by first MG 110 or second MG 120 is to be used for charging battery 150, the voltage is stepped down by converter 200.

A system voltage VH between converter 200, and first inverter 210 and second inverter 220, is detected by a voltage sensor 180. The result of detection by voltage sensor 180 is transmitted to MG-ECU 172.

First inverter 210 includes a U phase arm, a V phase arm, and a W phase arm. The U phase arm, the V phase arm, and the W phase arm are connected in parallel. The U phase arm, the V phase arm, and the W phase arm each include two npn transistors connected in series. Between the collector and the emitter of each npn transistor, a diode allowing the current to flow from the emitter side to the collector side is connected. The point of connection between the npn transistors in each arm is connected to an end, different from a neutral point 112, of a corresponding coil of first MG 110.

First inverter 210 converts the DC current supplied from battery 150 into AC current and supplies the AC current to first MG 110. First inverter 210 also converts the AC current generated by first MG 110 into DC current.

Second inverter 220 includes a U phase arm, a V phase arm, and a W phase arm. The U phase arm, the V phase arm, and the W phase arm are connected in parallel. The U phase arm, the V phase arm, and the W phase arm each include two npn transistors connected in series. Between the collector and the emitter of each npn transistor, a diode allowing current to flow from the emitter side to the collector side is connected. The point of connection between the npn transistors in each arm is connected to an end, different from a neutral point 122, of a corresponding coil of second MG 120.

Second inverter 220 converts the DC current supplied from battery 150 into AC current and supplies the AC current to second MG 120. Second inverter 220 also converts the AC current generated by second MG 120 into DC current.

Converter 200, first inverter 210, and second inverter 220 are controlled by MG-ECU 172. MG-ECU 172 controls first inverter 210 so that it outputs a torque in accordance with a torque command value that is input from PM-ECU 170. Likewise, MG-ECU 172 controls second inverter 220 so that it outputs a torque in accordance with a torque command value that is input from PM-ECU 170. In the configuration of FIG. 14, a group of circuits subsequent to SMR 230 corresponds to load 20 in FIG. 1. MG-ECU 172 is also capable of controlling the charging voltage or charging current for battery 150 by controlling converter 200.

As described above in connection with the first embodiment, when an inspection is to be conducted by battery checker 50, a predetermined charging condition has to be set for secondary battery 10. In the second embodiment, the power generation mechanism mounted on the hybrid vehicle is used to feed the charging power for battery 150.

Figure 15:
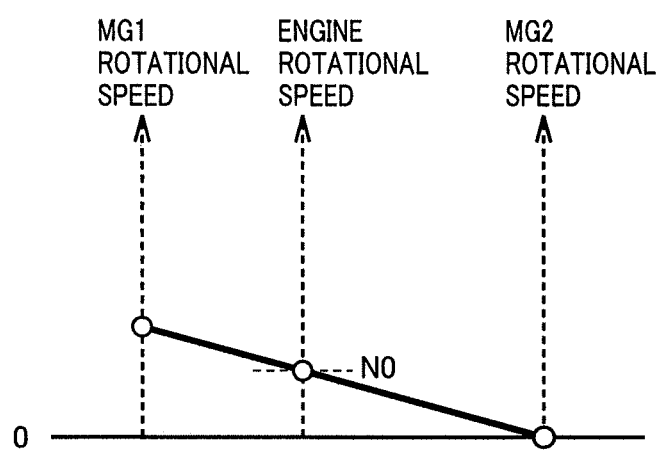
FIG. 15 is a nomographic chart illustrating an operation of a hybrid vehicle when its secondary battery is inspected.

FIG. 15 is a nomographic chart illustrating an operation of the hybrid vehicle when its secondary battery is inspected by battery checker 50.

Referring to FIG. 15, when battery checker 50 is attached to secondary battery 10 and mounted on the hybrid vehicle and further a mode signal giving an instruction to conduct an inspection of the secondary battery is input to PM-ECU 170, the hybrid vehicle changes into a battery inspection mode on the condition that the parking position is selected. In the battery inspection mode, PM-ECU 170 keeps the engine speed at a predetermined constant value N0. Namely, a control instruction is issued to keep the rotational speed of engine 100 at N0 and the amount of injected fuel and the ignition timing for example in engine 100 are controlled. Meanwhile, the rotational speed of second MG 120 is kept at zero. Namely, the hybrid vehicle is kept stopped.

PM-ECU 170 controls the electric power generated by first MG 110 so that battery 150 can be charged under the charging condition for the inspection, by setting the torque command value (negative torque) of first MG 110. For example, inverter 210 and converter 200 are controlled so that the charging current supplied to battery 150 through inverter 210 and converter 200 has a predetermined constant value.

Here, as described above, the charging condition (voltage and/or current) for the inspection of the battery is controlled so that it is larger than the upper limit in normal use. It is therefore preferable that the instruction for the battery inspection mode can specially be input when maintenance is done, rather than input through the user operation screen.

In this way, the secondary battery (battery 150) mounted on the electrically-driven vehicle such as hybrid vehicle can easily be inspected by means of battery checker 50.

Here, the configuration of the hybrid vehicle shown in FIG. 12 is given by way of example, and the secondary battery of the present embodiment can also be mounted on a hybrid vehicle having another power train configuration. The hybrid vehicle is not limited to the one mounted with the engine, as long as the hybrid vehicle is mounted with a power generation mechanism for charging secondary battery 10 while the vehicle is running.

Further, it should be noted that, while the present embodiment illustrates the secondary battery which is mounted on the electrically-driven vehicle, the present invention is also applicable to a secondary battery used for any apparatus, without particularly limiting the load.

It should be construed that embodiments disclosed herein are by way of illustration in all respects, not by way of limitation. It is intended that the scope of the present invention is defined by claims, not by the description above, and encompasses all modifications and variations equivalent in meaning and scope to the claims.

INDUSTRIAL APPLICABILITY

The present invention is applicable to inspection of a secondary battery in the form of a battery pack in which a plurality of battery cells are connected in series.

REFERENCE SIGNS LIST

10 secondary battery (battery pack); 12 voltage source; 12# capacitor; 13 casing (secondary battery); 14 recessed portion; 15 internal resistor; 16 temperature sensor; 17, 180 voltage sensor; 18 current sensor; 19 battery sensor; 20 load; 30 battery monitor unit; 42, 42(1)-42(n) inductor; 44, 44(1)-44(n) current limiting resistor; 45, 45(1)-45(n) zener diode; 50 battery checker; 52 detection inductor; 55 voltage detector; 56 casing (battery checker); 58 protruded portion; 100 engine; 112, 122 neutral point; 120, 150 battery; 130 power split device; 140 reduction gear; 160 front wheel; 170 PM-ECU; 172 MG-ECU; 200 converter; 210 first inverter; 220 second inverter; 240 DC/DC converter (auxiliary system); 250 auxiliary; BC, BC(1)-BC(n) battery cell; CU, CU(1)-CU(n) cell unit; DU, DU(1)-DU(n) detection unit; Ib battery current; Ich charging current; NO constant value (engine speed); Nv number of steps; T1-T3 time width; Tb battery temperature; Vb battery voltage; Vck voltage (battery checker); Vz, Vz(1)-Vz(n) breakdown voltage

The invention claimed is:

1. A secondary battery comprising:
a plurality of battery cells connected in series; and
a plurality of detection units connected in parallel with said plurality of battery cells respectively,
said plurality of detection units each including an inductor and a zener diode electrically connected in series between a positive electrode and a negative electrode of a corresponding battery cell,
each said zener diode having a breakdown voltage higher than a predetermined upper limit of an output voltage of a corresponding one of said battery cells in use such that, when the output voltage of the corresponding battery cell exceeds the breakdown voltage of the zener diode, the zever diode is rendered electrically conductive and allows the output voltage of the corresponding battery to flow through the inductor,
respective breakdown voltages of respective said zener diodes of said plurality of detection units being designed to have respective values different in a stepwise manner from each other.

2. The secondary battery according to claim 1, wherein
said plurality of battery cells include first to n-th battery cells connected successively, n being an integer of two or more,
said plurality of detection units include first to n-th detection units connected in parallel with said first to n-th battery cells respectively, and
said zener diode in an i-th detection unit has a breakdown voltage lower than the breakdown voltage of said zener diode in an (i+1)-th detection unit, i being an integer of one to (n−1).

3. The secondary battery according to claim 1, wherein
when said secondary battery is inspected, said secondary battery is supplied with a charging voltage higher than a charging voltage supplied to said secondary battery in use.

4. The secondary battery according to claim 3, wherein
said secondary battery is mounted on a hybrid vehicle,
said hybrid vehicle is mounted with a power generation mechanism for generating charging power for said secondary battery, and a control unit controlling said power generation mechanism, and
when said secondary battery is inspected, said control unit controls said power generation mechanism so that said secondary battery is supplied with constant current (It) larger than an upper limit of charging current for said secondary battery when said hybrid vehicle is being operated.

5. An inspection apparatus for a secondary battery,
said secondary battery including:
a plurality of battery cells connected in series; and
a plurality of detection units connected in parallel with said plurality of battery cells respectively, and
said plurality of detection units each including a inductor and a zener diode connected in series, said zener diode having a breakdown voltage higher than an output voltage of a corresponding one of said battery cells in use,
said inspection apparatus comprising:
a plurality of detection inductors connected in series; and
a voltage detector connected in series with said plurality of detection inductors to constitute a closed circuit, and
said plurality of detection inductors each being arranged so that, when said inspection apparatus is attached to said secondary battery for inspecting said secondary battery, each said detection inductor is magnetically coupled with said inductor in a corresponding one of said plurality of detection units in which respective breakdown voltages of respective said zener diodes are designed to have respective values different in a stepwise manner from each other.

6. The inspection apparatus for a secondary battery according to claim 5, wherein
when said secondary battery is inspected, said secondary battery is supplied with a charging voltage higher than a charging voltage supplied to said secondary battery in use.

7. The inspection apparatus for a secondary battery according to claim 6, wherein
said secondary battery is mounted on a hybrid vehicle,
said hybrid vehicle is mounted with a power generation mechanism for generating charging power for said secondary battery, and a control unit controlling said power generation mechanism, and
when said secondary battery is inspected, said control unit controls said power generation mechanism so that said secondary battery is supplied with constant current larger than an upper limit of charging current for said secondary battery when said hybrid vehicle is being operated.

8. A battery inspection system comprising:
a secondary battery; and
an inspection apparatus for said secondary battery,
said secondary battery including:
a plurality of battery cells connected in series; and
a plurality of detection units connected in parallel with said plurality of battery cells respectively,
said plurality of detection units each including a inductor and a zener diode connected in series,
each said zener diode having a breakdown voltage higher than an output voltage of a corresponding one of said battery cells in use, and
respective breakdown voltages of respective said zener diodes of said plurality of detection units being designed to have respective values different in a stepwise manner from each other,
said inspection apparatus including:
a plurality of detection inductors connected in series; and
a voltage detector connected in series with said plurality of detection inductors to constitute a closed circuit, and
said plurality of detection inductors each being arranged so that, when said inspection apparatus is attached to said secondary battery for inspecting said secondary battery, each said detection inductor is magnetically coupled with said inductor in a corresponding one of said plurality of detection units.

9. The battery inspection system according to claim 8, wherein
when said secondary battery is inspected, said secondary battery is supplied with a charging voltage higher than a charging voltage supplied to said secondary battery in use.

10. The battery inspection system according to claim 8, wherein
said secondary battery is housed in a first casing on which a recessed portion is formed,
said inspection apparatus is housed in a second casing on which a protruded portion shaped to fit in said recessed portion is formed, and
each said inductor and each said detection inductor are arranged respectively at said recessed portion and said protruded portion so that, when said protruded portion is fit in said recessed portion, said plurality of detection inductors s are each magnetically coupled with said inductor in a corresponding one of said plurality of detection units.

11. The battery inspection system according to claim 9, wherein
said secondary battery is mounted on a hybrid vehicle,
said hybrid vehicle is mounted with a power generation mechanism for generating charging power for said secondary battery, and a control unit controlling said power generation mechanism, and
when said secondary battery is inspected, said control unit controls said power generation mechanism so that said secondary battery is supplied with constant current (It) larger than an upper limit of charging current for said secondary battery when said hybrid vehicle is being operated.

12. An inspection method for a secondary battery including a plurality of battery cells connected in series, comprising the steps of:
attaching an inspection apparatus to said secondary battery, said inspection apparatus having a closed circuit constituted of a plurality of detection inductors and a voltage detector connected in series, and said secondary battery having a plurality of detection units connected in parallel with said plurality of battery cells respectively,
said plurality of detection units each including a inductor and a zener diode connected in series,
each said zener diode having a breakdown voltage higher than an output voltage of a corresponding one of said battery cells in use, and respective breakdown voltages of respective said zener diodes of said plurality of detection units being designed to have respective values different in a stepwise manner from each other, and
said plurality of detection inductors each being arranged so that, when said inspection apparatus is attached to said secondary battery, each said detection inductor is magnetically coupled with said inductor in a corresponding one of said plurality of detection units;
supplying a charging voltage higher than a charging voltage supplied to said secondary battery in use, to said secondary battery to which said inspection apparatus is attached;
measuring a parameter for determining, for each of said plurality of battery cells, whether said battery cell is degraded, based on a voltage waveform at said voltage detector after a test current is applied to said secondary battery;
determining whether an abnormal cell having an increased internal resistance is present among said plurality of battery cells, based on said measured parameter; and
identifying said abnormal cell among said plurality of battery cells based on said parameter, when it is determined that said abnormal cell is present.

13. The inspection method for a secondary battery according to claim 12, wherein
said parameter includes the number of steps in which voltage changes in a stepwise manner in said voltage waveform, and
said step of determining includes the step of determining whether said abnormal cell is present, based on said number of steps.

14. The inspection method for a secondary battery according to claim 12, wherein
said parameter includes a time width of each voltage step in which voltage changes in a stepwise manner in said voltage waveform, and
said step of identifying includes the step of identifying said abnormal cell among said plurality of battery cells, based on said time width.

15. The inspection method for a secondary battery according to claim 12, further comprising the steps of:
measuring said parameter by said inspection apparatus at the start of use of said secondary battery or when said secondary battery is new; and
storing said measured parameter as reference data, wherein
said step of determining includes the step of determining whether said abnormal cell is present, based on a comparison between said reference data and said parameter measured when inspection is conducted, and
said step of identifying includes the step of identifying said abnormal cell among said plurality of battery cells, based on a comparison between said reference data and said parameter measured when inspection is conducted.

16. The inspection method for a secondary battery according to claim 12, wherein
said secondary battery is mounted on a hybrid vehicle,
said hybrid vehicle is mounted with a power generation mechanism for generating charging power for said secondary battery, and
said step of supplying includes the step of controlling said power generation mechanism so that said secondary battery is supplied with constant current larger than an upper limit of charging current for said secondary battery when said hybrid vehicle is being operated.

17. The inspection method for a secondary battery according to claim 12, wherein
said secondary battery is housed in a first casing on which a recessed portion is formed,
said inspection apparatus is housed in a second casing on which a protruded portion shaped to fit in said recessed portion is formed,
each said inductor and each said detection inductor are arranged respectively at said recessed portion and said protruded portion, and
in said step of attaching, said protruded portion is fit in said recessed portion to allow said plurality of detection reactors each to be positioned so that said detection reactor is magnetically coupled with said reactor in a corresponding one of said plurality of detection units.

* * * * *